United States Patent [19]

Hansen

[11] Patent Number: 5,136,247
[45] Date of Patent: Aug. 4, 1992

[54] APPARATUS AND METHODS FOR CALIBRATED WORK FUNCTION MEASUREMENTS

[76] Inventor: Wilford N. Hansen, 855 S. 600 East, Logan, Utah 84321

[21] Appl. No.: 643,573

[22] Filed: Jan. 18, 1991

[51] Int. Cl.$^5$ .............................................. G01R 29/12
[52] U.S. Cl. ..................................... 324/457; 324/458; 324/453
[58] Field of Search ............... 324/452, 453, 457, 458, 324/661, 686, 690, 447, 449, 450; 204/435

[56] References Cited

U.S. PATENT DOCUMENTS 4,463,316 7/1984 Messens et al. ................. 324/457 X

OTHER PUBLICATIONS

Hansen, G., "Theory and Ex Situ Studies of the Electrochemical Double Layer," Ph D. Thesis, Utah State University, Logan, Utah, 1986/Dec. pp. 69–112; 122–151; 198–201.
Hansen, W. N. and Hansen, G. J., "Absolute Half-Cell Potential: A Simple Direct Measurement," *Physical Review A* 36:1396–1402, 1987/Aug.
Hansen, W. N. and Hansen, G. J., "Implication of Double-Layer Emersion," ACS Symposium Series 378, *Electrochemical Surface Science*, M. Soriage, Ed., American Chemical Society, Washington, D.C., 1988/Dec.

*Primary Examiner*—Jack B. Harvey
*Attorney, Agent, or Firm*—Trask, Britt & Rossa

[57] ABSTRACT

A method of making a calibrated measurement of the contact potential difference between a probe electrode and the surface of a sample surface involves the use of a reference standard. The reference standard comprises an electrolyte solution in electrical contact with an electrochemical half-cell; the surface of the electrolyte constitutes the reference surface whose CPD can be measured. The method is intended for use with apparatuses such as a vibrating capacitor or Kelvin probe, and allows the absolute work function of a sample surface to be determined from measurements obtained in a gas atmosphere. An apparatus incorporating the reference standard, and an improved vibrating capacitor probe, are also disclosed.

37 Claims, 6 Drawing Sheets

FRONT VIEW

Fig. 5A

SIDE VIEW

APPARATUS AND METHODS FOR CALIBRATED WORK FUNCTION MEASUREMENTS

BACKGROUND OF THE INVENTION

1. Field

The invention relates to the nondestructive testing of condensed matter surfaces, and more particularly to the measurement of the work function of the surface of a conductive sample.

2. State of the Art

The work function of the surface of an electronic conductor, solid or liquid, is defined as the minimum amount of work required to move an electron from the interior of the conductor to a point just outside the surface (beyond the image charge region). The work function measured for a particular material will vary if contaminants or coatings are present. Such variations can be used to determine the cleanliness of a surface, the uniformity of thickness of a coating, and other information about the condition of the surface. Thus, work function measurements are employed for nondestructive evaluation of surfaces of various construction parts and materials.

At present, typical methods for determining the absolute work function must be performed in vacuum conditions. However, for industrial purposes it is usually not practical to perform testing in vacuum. Methods which can be used in gas atmospheres generally are useful only to compare the work functions of two surfaces. These methods are based on the fact that there is a contact potential difference (referred to hereinafter as CPD) between the surfaces of two conducting materials that are electrically connected. For purposes of this application, the contact potential difference (CPD) is defined as the difference between the outer potentials (beyond the image charge region) of two electrically connected conducting materials. The outer potentials are themselves related to the work function of the sample surface. This work function depends both on the material of the sample itself, and the condition of the surface which is being examined. Therefore, the CPD between two surfaces reflects the difference in the work functions of their respective sample surfaces.

Typical methods for measuring the CPD involve the creation of a capacitance circuit by electrically connecting the sample and a probe electrode to each other via an external circuit. In this application, such techniques will be designated by the term "capacitance techniques". The probe electrode is positioned just above (but not touching) the sample surface, so that the probe electrode and the sample surface constitute two plates of a capacitor. The capacitance may be varied to cause a current flow which can be detected and correlated to the CPD.

Two such methods will be described in more detail. In the first technique, termed the vibrating capacitor or Kelvin probe technique, the separation between the two capacitor "plates" is varied by vibrating the probe electrode. The changes in plate separation in turn modulate the capacitance and cause an ac current to flow in the external circuit. A variable voltage source in the external circuit is used to apply a voltage to one of the "plates". The voltage is adjusted so that no current flows between the sample and the probe electrode. The voltage required to achieve a null current flow reflects the CPD between the sample and the probe. U.S. Pat. No. 4,072,896 to Bjilmer, U.S. Pat. No. 4,649,336 to Bindner et al, and U.S. Pat. Nos. 4,409,509 and 4,100,442 to Besocke, describe such Kelvin-type probes.

The second capacitance technique which is described is the radioactive probe method. Here, the probe includes a radioactive electrode material which ionizes the gas between the sample and the electrode. The ionization changes the dielectric properties of the capacitor and thereby allows a detectable current to flow. If there is a difference in potential between the reference and the sample, a current will flow across the gap. In the most common application, the variable voltage source is adjusted to change the potential between the capacitor plate lead wires sufficiently to null the current flow. As with the Kelvin probe method, the voltage (potential) required to achieve the null current state reflects the CPD between the two "plates" of the capacitor.

The measurement of CPD in a gas environment by capacitance probes presents problems of reproducibility because adsorption of gas on a surface may cause significant changes in the work function. Such adsorption affects not only the samples being tested, but also the probe. A change in the work function of the probe electrode is virtually indistinguishable from a change in the work function of the sample. Other kinds of surface-gas interactions, as well as changes in weather conditions such as relative humidity, also can strongly influence the measurements made by Kelvin probes and other capacitance probes.

Typical Kelvin probes have used gold or a similar precious metal as the material for the probe electrode in the belief that such metals will not be subject to significant adsorption effects. However, it has been found experimentally that in a gas environment, the work function of even a gold surface drifts at unpredictable rates. For reproducible results, gold probe electrodes must be kept stored under special conditions to minimize adsorption changes. Moreover, gold probes are relatively expensive. In the event that it becomes contaminated with other substances, it cannot be discarded and must instead be carefully cleaned.

Consequently, a need exists for means to more easily and reliably calibrate capacitance measurements of the contact potential difference of a surface in a gas environment. There further exists a need for means to determine the absolute work function of a surface in a gas environment. A need further remains for an inexpensive and stable vibrating capacitor probe.

SUMMARY OF THE INVENTION

The application is directed to a method of calibrating a measurement of the contact potential difference (CPD) between a conductive probe and the surface of an electrically conductive sample with a reference standard, thereby producing a measurement reflective of the work function of the sample surface. The method is performed with a CPD detection apparatus of the kind having a probe with a conductive portion placeable adjacent to the surface of a sample such that, when the probe conductive portion and the sample are connected by an external circuit, the conductive portion and sample surface effectively constitute two plates of a capacitor. The apparatus includes detection means operable to complete the external circuit between the probe conductive portion and the sample surface, and to detect the contact potential difference therebetween.

The method comprises the following steps. First, a reference device is provided, comprising an electrolyte solution in electrical contact with an electrochemical half-cell, the half-cell including a half-cell electrode. The electrolyte solution has a surface which constitutes a reference surface for purposes of the measurement. The half-cell electrode is electrically connected to the detection means to be held at a fixed ground potential relative to the probe conductive portion. The conductive portion is positioned proximate but not touching a surface of the electrolyte solution to form a reference capacitor. With the probe so positioned, the detection means is activated to measure the contact potential difference between the reference surface and the conductive portion to produce a reference measurement. The half-cell electrode is then disconnected from the detection means.

A sample measurement is taken by connecting the sample to the detection means to be held at ground potential, and positioning the probe conductive portion proximate the sample surface, to form a test capacitor. The detection means is activated to measure the contact potential difference between the sample surface and the probe conductive portion to produce a sample measurement. The sample measurement is converted to a calibrated test measurement via a calculation based on the reference measurement. The calibrated test measurement is reflective of the work function of the sample surface.

A simple form of the reference standard comprises a shallow glass dish of an unsaturated aqueous salt solution with a saturated calomel half-cell in contact via a liquid junction with the solution Various combinations of half-cells and electrolyte solutions can be used. Preferably, the half-cell is of the type considered reference half-cells in the art.

An apparatus for practicing the method includes a probe with a conductive portion connected to detection means, a reference standard, and capacitance varying means. The reference standard comprises a vessel containing an electrolyte solution having a reference surface, and an electrochemical half-cell in electrical contact with the electrolyte solution. The detection means is operable to hold the sample or the electrode of the reference half-cell at a fixed ground potential relative to the probe conductive portion, and to measure the contact potential difference between the probe conductive portion and the surface of the sample. The detection means is further operable to detect the current induced by operation of the capacitance varying means and to apply a voltage to the probe to nullify the current. Optionally, the apparatus further includes switching means for disconnecting the sample and connecting the reference device to the detection means to form sample and reference capacitive circuits.

In a preferred embodiment, the apparatus further includes means for providing a fresh surface to the electrolyte solution, which may be in the form of a reservoir of electrolyte solution connected to selectively flush the vessel. Desirably, the detection means includes means for adjusting the probe reading of the standard to its known value before proceeding to measure the CPD with respect to the test sample.

The apparatus may additionally include an improved vibrating capacitor probe. The probe itself includes a conducting portion comprising a piece of flexible conducting film disposed to cover the end of a hollow tube. The film is caused to vibrate by acoustic waves transmitted through the tube from a speaker at the other end of the tube. The probe has the advantage of having an extremely stable work function in gas environments. Also, the design permits the vibrational source (the speaker) to be placed at some distance from the probe, which greatly reduces interference from the vibrational source in the probe measurements. Moreover, the invented probe is relatively inexpensive and easily constructed so that it can be disposable if the surface becomes contaminated during use.

BRIEF DESCRIPTION OF THE DRAWINGS

FIGS. 1 (a) and (b) are schematic diagram of a probe and test surface with electronic energy levels graphically depicted;

FIGS. 5 (a) and (b) show embodiments of the reference standard in the form of a cell with flushing capability;

FIGS. 6 (a) and (b) are simplified illustrations of the probe body of the improved vibrating capacitor probe and steps in its construction.

DETAILED DESCRIPTION OF THE INVENTION

The invention is directed to the use of an electrochemical half-cell as a reference standard for determining the absolute work function of a conducting material from measurements of the CPD between the conductor and a probe. A half-cell whose absolute half-cell potential is stable and already known is preferred. The standard is simple, stable, highly reproducible, and permits the determination of the absolute, as opposed to relative, work function of a sample surface in a gas environment.

For an electrochemical half-cell, a theory of the relationship between the absolute half-cell potential and the Fermi level of electrons in the lead wire of the half-cell, has been developed (see Absolute half-cell potential: a simple direct measurement, W. N. Hansen and G. J. Hansen, *Physical Review A* 36:1396–1402, 1987). It is further known that the absolute potential of a half-cell can be determined using a vibrating capacitor probe to measure the CPD, by comparison to a metal whose absolute work function is known.

Figure 1A:
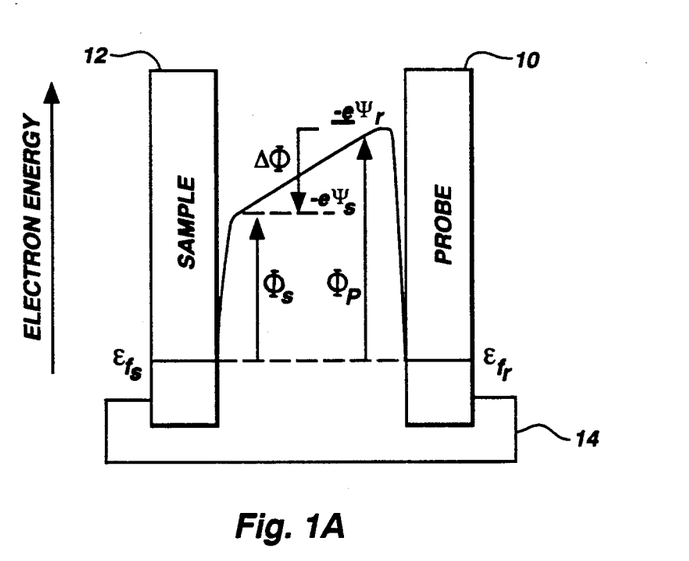

FIG. 1 illustrates the use of capacitance methods for measuring the contact potential difference between a probe electrode and a test surface. Probe electrode 10 has a Fermi level $\epsilon_{fp}$ and outer potential p, while sample 12 similarly has Fermi level $\epsilon_{fs}$ and outer potential $_s$. The plate separation is exaggerated. As shown in FIG. 1A, when probe electrode 10 and sample 12 are electrically connected via circuit means 14 their respective Fermi levels are equal, while the outer potentials $_s$ and $_p$ differ. The difference between the outer potentials causes a current to flow between the probe and &:he sample until equilibrium is reached. Work functions $\Phi_p$ and $\Phi_s$ are constant and depend only on the materials of the probe and the sample. When the Fermi levels of the probe and sample are equilibrated via the external circuit as shown in FIG. 1A, the outer potential multiplied by the charge on the electron e equals the work function, when taken with respect to the Fermi level.

Figure 1B:
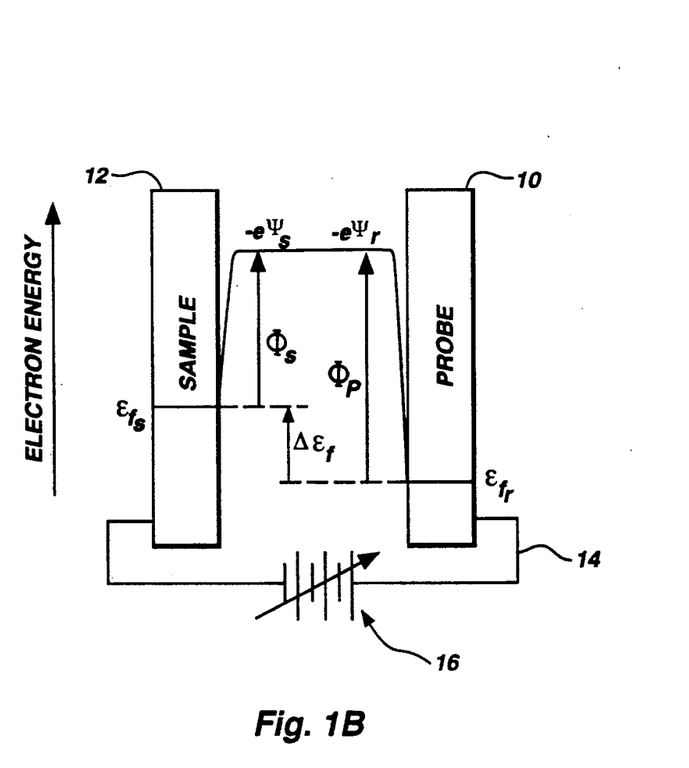

In FIG. 1B, circuit means 14 includes an external voltage source 16. When source 16 is activated to apply a voltage to equalize the outer potentials $_s$ and $_p$, no current flows between probe electrode 10 and sample 12. The difference in the work functions $\Phi_s$ and $\Phi_p$ becomes equal to $-\text{delta } \epsilon_f$ (the difference in the Fermi levels of the sample and probe when the voltage is being applied).

The inner potential of an electrolyte can be defined as the work required to bring a unit charge from infinity to within the electrolyte. When the electrolyte is brought into contact with a half-cell, the inner potential of the electrolyte becomes fixed with respect to the Fermi level of the half-cell electrode. Under this condition, the outer potential of the electrolyte, or in other words the CPD measured between the electrolyte solution surface and a probe electrode, is equivalent to the absolute potential of the half-cell. For purposes of this invention, the term work function is defined to include both the work function of a condensed matter surface, and the absolute half-cell potential of a half-cell. The absolute half-cell potential is known in the art as the minimum work required to remove an electron from within an electrode which is in contact with an electrolyte to a point just outside the surface of the electrolyte.

A method for using the reference standard to obtain a calibrated measurement of the work function of a sample surface has as its first steps the provision of the reference standard, sample of a conductive material, and CPD detection apparatus including a probe and detection means.

Figure 2:
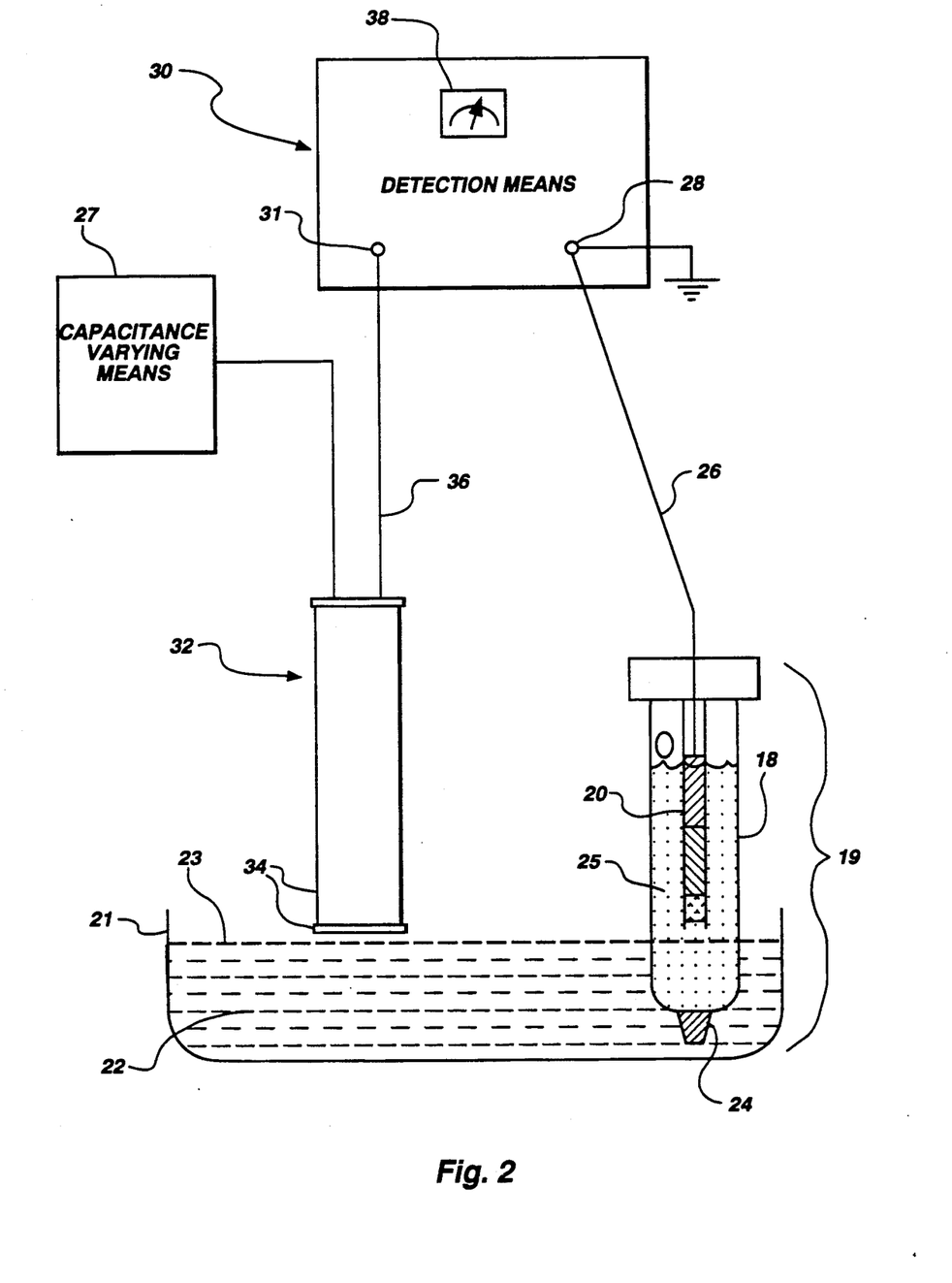
FIG. 2 depicts a simple embodiment of the reference standard of the invention.

FIG. 2 depicts a simple embodiment of the reference standard. The reference standard, indicated generally at 19, is an electrochemical half-cell 18 which is in liquid contact through liquid junction 24 with an electrolyte solution 22 contained in vessel 21. Half-cell 18, as known in the art, includes a cell electrode 20, a cell electrolyte 25, and a metal-electrolyte paste 17 which connects electrode 20 and electrolyte 22. Lead wire 26 of half-cell 18 is connected to electrode 20 and provides connection means for connecting half-cell 18 to electronic detection means generally indicated at 30. Further details of the reference standard, including the composition of the electrode and the electrolyte solution, are provided in a later section.

Probe 32 may be almost any capacitance-type CPD probe, including both vibrating capacitor probes and radioactive probes. Probe 32 has a conductive portion 34 which, during a measurement, is positioned adjacent a surface being measured. In FIG. 2 this is shown as the electrolyte surface 23 of the reference standard. (However, in the case of a sample measurement it would be the surface of a sample which is electrically connected to input 28.) When conductive portion 34 and half-cell 18 are electrically connected via an external circuit including detection means 30, conductive portion 34 and surface 23 effectively constitute two plates of a capacitor in a capacitive circuit.

Capacitance varying means 27 must also be provided for varying the capacitance of the capacitor, thereby to cause a current flow which can be detected by the probe and the detection means. In FIG. 2, capacitance varying means 27 is operably connected to probe 32, as would be required to induce vibration of a vibrating capacitor probe. However, in the radioactive probe method, capacitance varying means is a source of radiation capable of ionizing the gas between the capacitor "plates", thereby changing the dielectric properties of the gas and allowing current to flow across the gap. In such case, the capacitance varying means embodied as the radiation source need only be operably disposed relative to the probe and sample. It need not be associated either mechanically or electrically with the probe or the detection means.

Detection means 30, as known in the art for capacitance measurements of CPD, has a detection input 3 and a grounding input 28 (FIG. 2). Inputs 31 and 28 are for connecting a sample (which may be the reference standard), and conductive portion 34 of probe 32, to the detection means.

In FIG. 2 and in the preferred embodiment of the method, probe 32 is connected to the detection input 31 and the reference (or sample, when making sample measurements) is connected to grounding input 28, to form a capacitance circuit wherein the reference (or sample) is held at a fixed potential, termed "ground" for purposes of this application, relative to conductive portion 34 of probe 32. For the method using the half-cell reference standard, this configuration is preferable largely for reasons of convenience. However, the opposite configuration, with the probe connected to the fixed potential input, can also be used.

Figure 3:
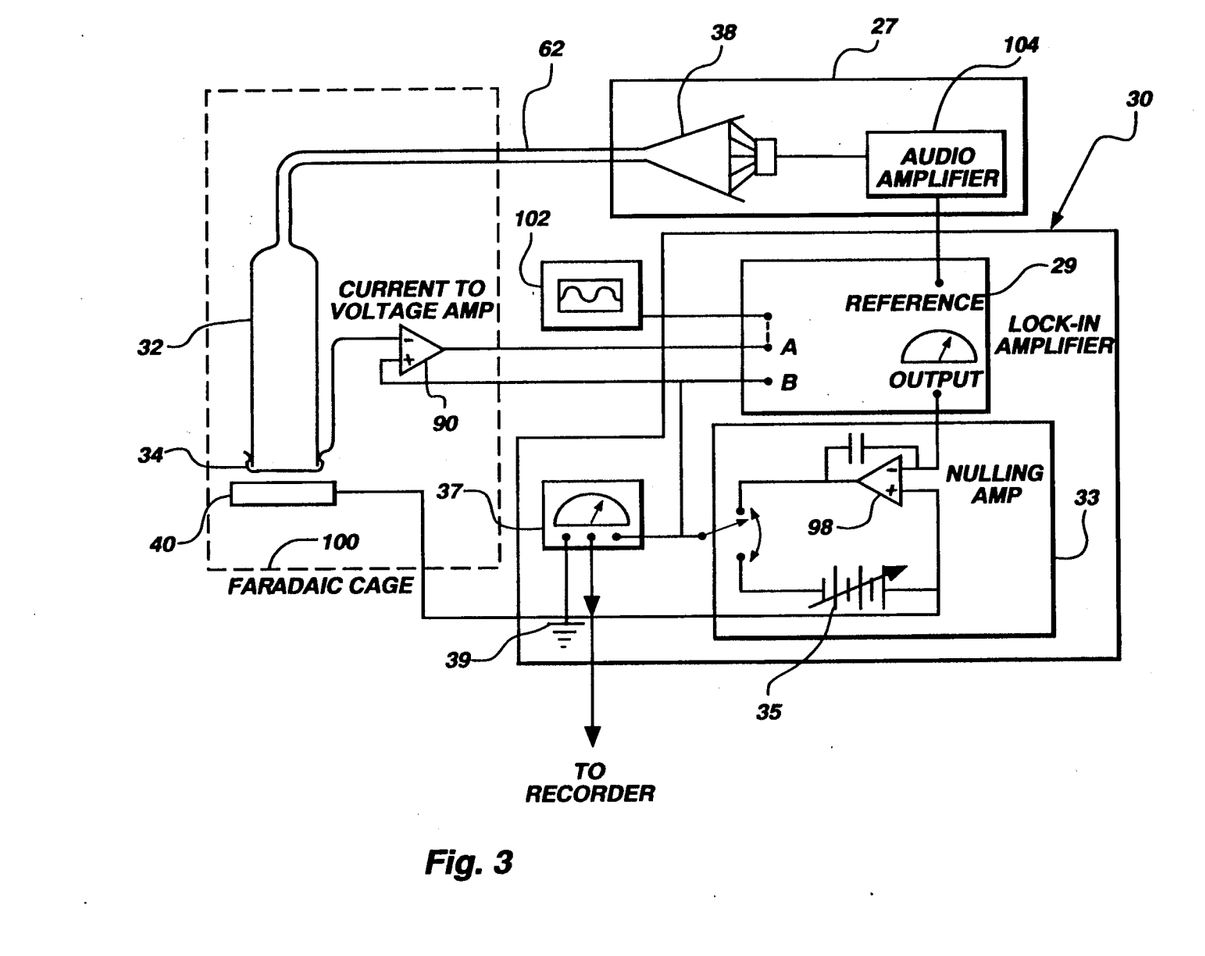
FIG. 3 is a simplified schematic diagram of a detection means useful to perform the method, together with the improved probe.

FIG. 3 depicts the electronic features of a detection apparatus for a Kelvin-type probe in more detail. Detection means 30 includes a lock-in amplifier 29 connected to detection input 31 which constitutes means to detect current flow from conductive portion 34. A nulling circuit 33 is connected to amplifier 29 and includes a voltage source 35 for applying an adjustable voltage to nullify the detected current flow. A voltmeter 37 is associated with nulling circuit 33 for reading the applied voltage. Ground 39 is connected to both amplifier 29 and the grounding input 28, to complete the circuit between the sample or reference and the probe. Amplifier 29, ground 39 and nulling circuit 33 with voltage source 35 may be regarded as operation means for making measurements of the capacitance circuit which includes conductive portion 34 of the probe and the surface of the sample or reference.

While detection means 30 is described as a particular embodiment for use with a vibrating capacitor probe, the method embraces other embodiments of detection means which could be used with the radioactive probe method. It is within contemplation that the method can be employed with any probe and detection means useful to measure a contact potential difference between a conductive probe and the surface of a conductive material, in a gas atmosphere.

In FIG. 3, probe 32 is depicted as the improved probe described elsewhere in this application. Accordingly, capacitance varying means 27 is depicted as the speaker 37 associated with an audio amplifier 104 and connected to probe 32 by tubing 62.

Desirably, portions of the apparatus including probe 32, a sample 40 to be measured, and reference standard 19 (not shown in FIG. 3) are placed inside a Faraday cage during use (FIG. 3). In this way, noise and detection errors from the electronics of detection means 30 and other external sources are reduced.

For making a reference measurement, probe 32 is positioned with conductive portion 34 just above the surface 23 of liquid 22 to form a first capacitive circuit (FIG. 2). As known in the art, conductive portion 34 must be outside the image charge of the surface, yet near enough for adequate detection of current flow between the probe and the surface. As a matter of practical manipulation to avoid contact between the probe and the sample surface, distances from about 0.5 to about 2 millimeters have been found to give good results.

With probe 32 appropriately positioned above liquid surface 23, the capacitance varying means 27 is activated to cause current flow between the reference surface 23 and conductive portion 34. Detection means 30 is activated to detect the current and to apply voltage to conductive portion 34 to nullify the current flow. The voltage required to nullify the current flow is read at voltmeter 38 of the detection electronics 30. This voltage is a reference measurement reflective of the CPD between reference surface 23 and electrode 34. The reference measurement further constitutes a calibration value corresponding to the known absolute half-cell potential of the half-cell, to which a sample measurement may be compared to derive the absolute work function of the sample surface.

For making a sample measurement, the reference standard is disconnected from input 28 and a sample is connected to ground via input 28. Probe 32 is repositioned with conductive portion 34 proximate the surface of the sample in substantially the same manner as it was positioned proximate the reference surface. Capacitance varying means 27 and detection means 30 are activated as previously described to measure the CPD between conductive portion 34 and the surface of the sample to produce a sample measurement.

A calibrated work function value may then be calculated from the sample measurement using the calibration measurement and the known value of the absolute half-cell potential of the half-cell in the reference standard.

To assure the best accuracy, it is preferable to periodically provide a fresh liquid surface before taking a calibration measurement. Preferably, this is accomplished by replacing part or all of the electrolyte solution in the vessel, for example by providing a reservoir of clean electrolyte and pouring clean electrolyte from the reservoir into vessel 21.

Alternatively, during a series of test measurements, repeated calibration measurements may be made and used simply to compensate for changes in the probe readings due to changes in the electronics, stray currents, adsorption of water or gas on the conductive portion, etc (sometimes called probe "drift"). So long as the liquid surface 23 of the reference device remains substantially clean and uncontaminated, the absolute half-cell potential measured in the manner described is substantially constant. If contamination is suspected, an accurate reading can be obtained using a fresh reference surface obtained by flushing the vessel with fresh electrolyte from the reservoir.

A significant advantage of the method is that it permits determination of the absolute work function of condensed matter surfaces from measurements made in a gas atmosphere. Moreover, the calibration is substantially independent of the gas in which the measurements are made and the type and concentration of electrolyte. Instead, the calibration depends primarily on the half-cell which is used in the reference standard.

Optionally, the probe may be adapted to be purged with a desired gas such as nitrogen or argon, or the measurements may be made in a purge box containing the desired gas. Use of purge gases may help to reduce adsorption and contamination of test surfaces in air, and water adsorption on the conductive portion from the electrolyte solution.

The reference standard may be any electrochemical half-cell presenting an electrolyte solution surface suitable for reliable CPD measurements. It is highly desirable that the electrolyte solution be free of particles or contaminants which disrupt the surface. Thus, it is preferable to use water of high purity, for example distilled water, and electrolyte which is also clean and of high purity. Because saturated solutions tend to form crystals which disrupt the solution surface, the electrolyte solution surface of the reference standard must usually comprise a less than saturated solution.

Half-cell 18 (FIG. 2) may be any half-cell whose potential is stable. Preferably, half-cell 18 should be chosen from the group of half-cells useful as reference half-cells, as known in the art. Such a reference half-cell is well-defined with a stable, known potential fixed by its chemical constituents. A saturated calomel electrode, silver-silver chloride electrode, or mercury-mercury sulfate electrode, are examples of half-cell electrodes useful in the invention.

Almost any electrolyte can be used for electrolyte solution 22. However, the electrolyte composition should be chosen in relation to electrode 20 to minimize the potential of the liquid junction (contact means 24) which electrically connects the two. Preferably, the junction potential should be less than about ten millivolts. Strongly acidic or corrosive solutions such as hydrochloric acid can be used, but are generally less desirable, as their vapors appear to affect the conductive portion of the probe. The reference device is not limited to aqueous electrolytes and may also be embodied with organically-based half-cells and electrolyte solutions. One such organic half-cell has acetonitrile as the solvent in place of water, tetrabutylammonium hexafluorophosphate salt as the electrolyte, and ferrocene/ferrocinium as the redox couple.

As shown in FIG. 2 and known in the art, half-cell 18 itself contains an internal electrolyte 21. If this internal electrolyte has characteristics suitable for the reference surface, then it may be used as electrolyte 22 in the reference standard.

The concentration range for electrolyte solutions useful in the reference device spans from $10^{-6}$ molar to at least about 80% saturated. Completely saturated solutions are undesirable, because of the tendency of small crystals to form and disrupt the surface. There must be sufficient ions present to be effective as a conductor. However, concentrations of 0.0001 molar and even $10^{-6}$ molar have been found to work in the reference standard.

Some electrolytes or electrolyte concentrations may be unsuitable or may be incompatible with a particular half-cell. Such incompatibility may be manifested in crystallization of one of the solution components, excessive junction potentials, etc. Perchlorate solutions have been found to be problematic both in being subject to crystallization when brought into contact with the reference half-cell, and in that the surface potential appears to be concentration-dependent for solutions >0.1 molar. Where the junction potential is high, it can be compensated for by subtracting its known value from the measurement. However, it is generally desirable to avoid the necessity of compensating for the junction potential by appropriate selection of half-cell and electrolyte.

In a highly preferred embodiment, the half-cell electrode is a saturated calomel electrode (referred to hereinafter as SCE), and the electrolyte solution is KCl at a concentration which may be anywhere from about 0.0001 M to about 80% saturated ($\approx 4$ molar). This embodiment has the advantages of incorporating a very well-defined, stable, readily available half-cell and an inexpensive, simple electrolyte. However, it has been found that the CPD depends primarily on the half-cell, and changes little if at all for different concentrations or different electrolytes. Sodium chloride, sodium fluoride, sodium sulfate, and disodium phosphate are among the electrolytes which have given good results in combination with the SCE.

Figure 4:
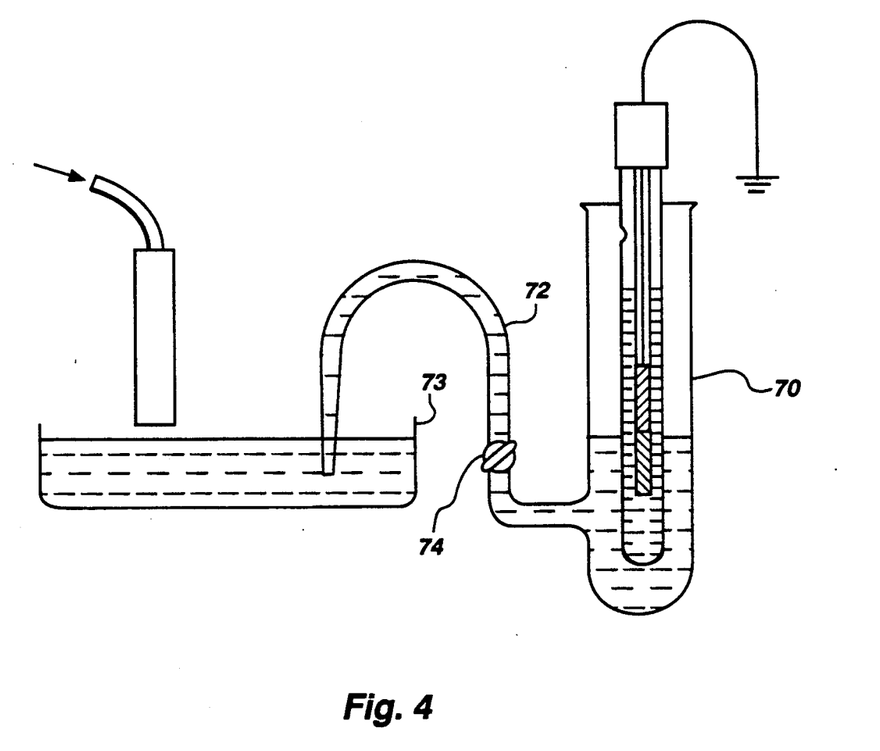
FIG. 4 shows another embodiment of the reference standard.
Figure 5A:
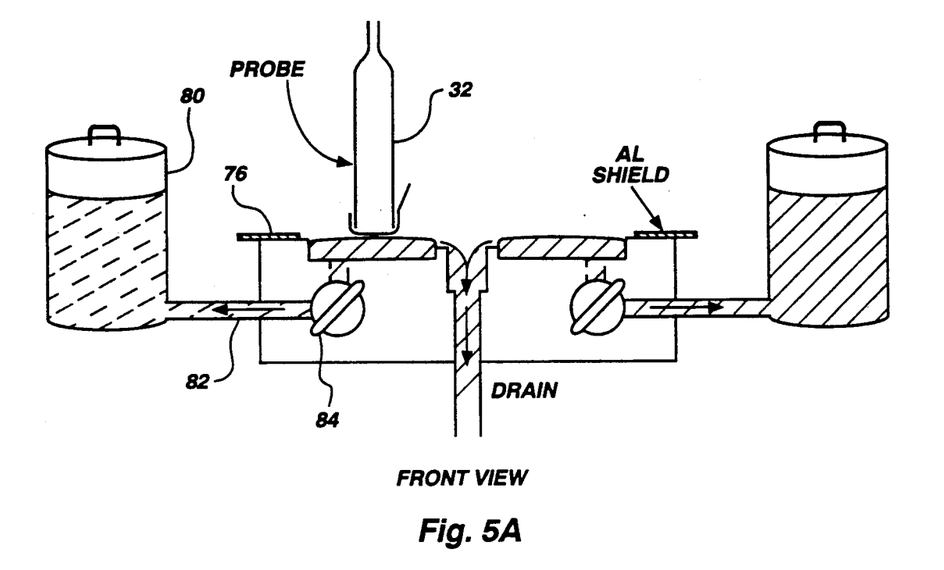
Figure 5B:
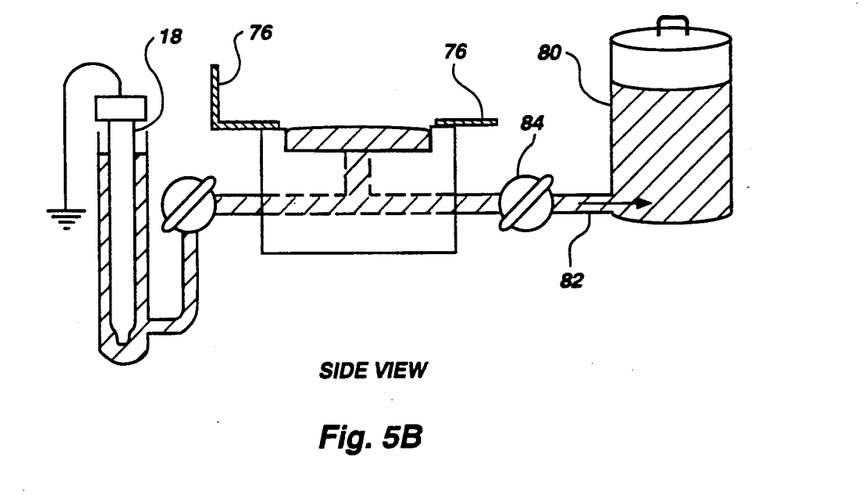
Figure 6A:
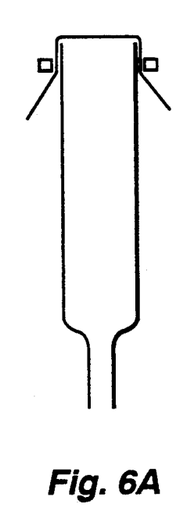
Figure 6B:
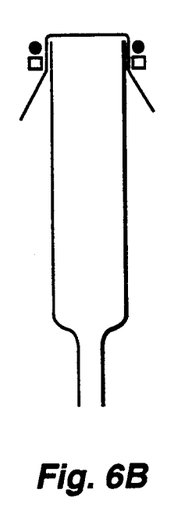
Figure 6C:
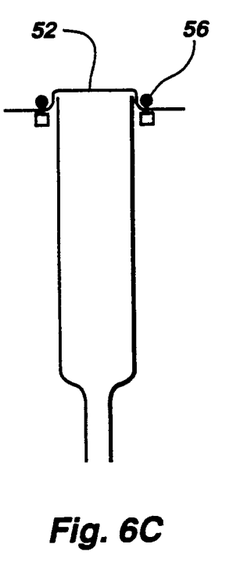
Figure 6D:
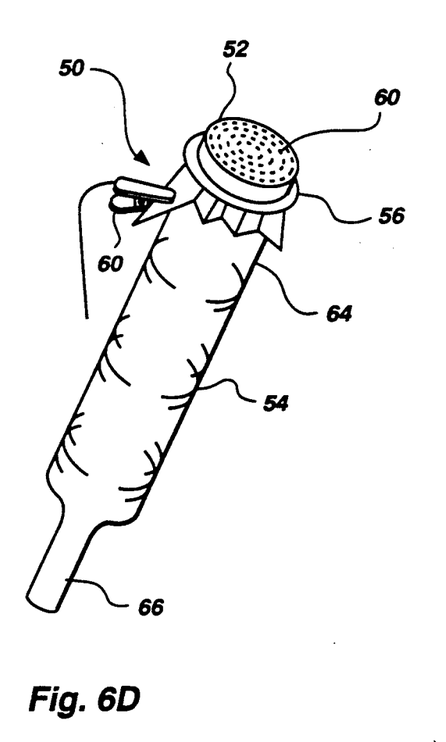

An alternate embodiment of the invention is a contact potential difference measuring apparatus incorporating the reference standard. The apparatus includes detection means substantially as described with reference to the method and FIG. 2. Additionally, the apparatus includes a reference cell as described hereinabove. FIGS. 4 and 5 are alternate embodiments of reference standard devices useful in the apparatus. In FIG. 4, half-cell 18 is partially immersed in the electrolyte in a tube 70, which is connected by a channel 71 to the electrolyte in vessel 73. Optionally, a stopcock 74 controls the conductive contact between the electrolyte within tube 70 and that in dish 73.

In a preferred embodiment, the reference cell includes means for flushing the vessel containing the electrolyte from a reservoir (FIG. 5). A reservoir 80 of clean electrolyte is connected by a channel 82 with a stopcock 84 to a dish portion 86 providing an exposed liquid surface for measurement. Reservoir 80, channel 82 and stopcock 84 together constitute means for flushing the reference standard with fresh electrolyte Half-cell 18 is partially immersed in a tube 120 which is in fluid communication with dish portion 86 through channel 122; channel 122 is optionally provided with normally-open stopcock 124. Stopcock 84 can be opened to allow electrolyte from reservoir 80 to flush dish portion 86. Dish portion 86 has a drain side 88 which is slightly shorter than the opposite side, so that overflow electrolyte will be directed into drain means 89 during flushing. Desirably, the body of the cell including dish portion 86 is made of TEFLON, while other parts are made of glass or inert ceramic. Optionally, the cell is further provided with electrostatic shielding 76 for reducing buildup of static electricity on the body of the cell.

Desirably, to eliminate the need for connecting and disconnecting the reference standard from the detection electronics, the apparatus would include two grounding inputs with a switching means for selectively connecting one of these inputs to ground 39. One input would be permanently committed to connection to the reference standard, and the other would be for connection to a sample. Depending on whether the probe was positioned for a reference measurement or a sample measurement, an operator would operate the switching means to connect the reference standard or the sample, respectively, to ground 39 to complete the capacitive circuit.

In the envisioned commercial embodiment, detection electronics 30 would also be provided with means for adjusting probe 32 to provide that the voltage read from the reference standard is essentially equal to the known reference value. In this way, the probe itself can be conveniently calibrated for direct reading of the work function from a sample measurement.

A highly significant feature of the reference standard is that it can be used to determine the absolute work function of solid and liquid surfaces in a gas environment. At present, the work function or absolute half-cell potential of the reference standard must be determined empirically by comparison to measurements made on a surface whose work function is accurately known. For the embodiment comprising an SCE in contact with 0.1 molar KCl, values determined so far range from about $4.635\pm 0.05$ eV to about $4.67\pm 0.027$ eV. However, it is expected that this value will be defined more accurately in the future.

FIGS. 3 and 6 show an improved vibrating capacitor probe. The probe 50 is designed for use in a gas atmosphere. A thin conductive film 52 is fastened to cover one end of a tube 54 and constitutes the conductive portion of the probe (FIG. 6). In the illustrated embodiment, the film is held in place by an O-ring 56. An acoustic speaker assembly 58, indicated in the schematic of FIG. 3, is connected at the other end of the tube to provide sound waves which travel down the tube to metallic film 52 and cause it to vibrate.

For CPD measurements, conductive film 52 is electrically connected to the probe circuitry, preferably via current-to-voltage amplifier 90 (FIG. 3). A sample 40 (or reference standard) whose surface CPD is to be measured is connected to ground relative to the probe head. The probe head is then brought near the sample surface. Film 52 vibrates sinusoidally in response to the sound waves transmitted from speaker 38. The film vibration in turn causes a sinusoidal modulation of the capacitance between film 52 and the sample surface, thereby creating the current which is detected and nullifed to measure the CPD.

Preferably, film 52 covering the tube end is without significant wrinkles and is relaxed enough to vibrate freely with the sound wave transmitted through the tube. It is important that film 52 vibrate in a simple mode such that the entire film surface moves together in the same direction. Desirably, film 52 has a composition which is relatively non-reactive to humid conditions and having a reasonably stable work function. It is also important that the work function be uniform over the area of film forming the probe head.

Film compositions including a metal which stabilizes its surface in air by forming an oxide coating, are particularly suitable Such a thin oxide coating is believed to reduce gas adsorptivity effects. Metals which form such an oxide coating include aluminum, chromium, and indium. Doped tin oxide glasses, such as can be made thin enough to be vibrated, are also suitable.

In a preferred embodiment, film 52 is an aluminum coated plastic such as aluminized MYLAR. A probe head made of aluminized MYLAR has been found to be more stable than gold electrodes. The probe surface appears to be relatively immune to surface adsorption effects in a gas environment.

Film 52 may optionally be provided with a multiplicity of small holes 60 to allow purging of the head with a gas. Such purging with a suitable inert gas such as nitrogen or argon may help keep the work function of film 52 constant, especially when the probe is used with liquids whose vapor pressures are substantial. In such an embodiment, a slow flow rate purge gas is introduced near the speaker assembly and flows out of the holes in the probe head.

Tube 54 which comprises the probe body may be made of glass or other material which preferably is not strongly sound-absorptive. In a preferred embodiment depicted in FIG. 6, tube 54 has a wide end 64 to form a sound chamber, and a narrow end 66. The film covers the wide end. This design has been found to provide a good signal-to-noise performance in vibrating the film. Acoustic speaker 38 (FIG. 3) is operably connected to transmit sound waves into tube end 66 toward the film. The frequencies useful are in the audio range from about 30 Hz to about 20,000 Hz. Desirably, speaker 38 has its frequency adjusted or "tuned" to create a resonant standing wave in the film. The tuned frequency will depend on the dimensions and materials of both tube 54 and conductive film 52. For the illustrated embodiment with tube 54 made of glass and film 52 of the probe head being aluminized MYLAR of about 1 sq cm area, a frequency of about 500 Hz is suitable.

In a preferred embodiment, a length of connector tubing 62 connects the speaker to the end of the probe body so that the speaker and its driving electronics can be placed at some distance from the probe. A connector made of a relatively inert, flexible plastic such as TEFLON gives excellent results with the aqueous electrolyte solutions of one embodiment of the novel reference standard. However, a high purity metal tubing such as copper may give better results with samples which are prone to substantial gas adsorption effects, such as mercury.

The dimensions of the probe head (the circular area of tube end 64) can be varied depending on the spatial resolution and sensitivity which is desired. Three factors having conflicting effects require consideration. First, the spatial resolution obtainable is limited to an area about the size of the probe head. Second, differences between the vibrational displacement of the film near the center relative to that near the edges which fixed to the tube, should be minimized. For these two reasons, it is desirable to make the head as small as possible. However, from the perspective of the detection electronics it is desirable to increase the area of the probe head, because the ac current is proportional to that area. A compromise which has produced good results is to have a probe head area of about one-half to two square centimeters. Nevertheless, if the sensitivity of the detection circuitry can be improved, smaller probe heads are within contemplation.

It is moreover believed that for greatest sensitivity, the maximum vibrational displacement delta x of the film should be similar to the closest approach distance of the probe head to the sample surface. For manual manipulations and in order to prevent accidental contact between the probe and the sample, the closest practical approach of the probe head to the sample surface is between around 0.5 millimeters to around 1 millimeter. Accordingly the maximum displacement of the film during vibration should similarly be no more than 1 millimeter.

The quality of the probe can be tested by monitoring the detected ac current wave form on an oscilloscope. Ideally, the wave form conforms as nearly to the sinusoidal shape of the acoustically-transmitted sound wave as possible. For such monitoring, the ac input should be unfiltered and the amplifier noise must be low enough to see the signal.

The invented probe has been found to be more stable than gold Kelvin electrodes for CPD measurements. It is moreover simple and inexpensive as compared to gold electrodes. The acoustic probe is especially well suited for use with the invented reference device, because the probe head must be placed close to the liquid surface during measurements. Thus, there is a significant risk of contaminating the probe head with the liquid. Accordingly, it is highly desirable to use a probe which can be easily and inexpensively replaced, such as the acoustic probe of the invention. Additionally, because the vibrational source (the speaker and its driving electronics) can be positioned at some distance from the probe, interference from the vibrational source is significantly reduced.

FIG. 3 diagrams both a capacitance varying means which is incorporated into the improved probe and detection means 30 having features useful with the improved probe. A current-to-voltage amplifier 90 takes the ac signal from the probe film (conductive portion 34), superimposed on the dc voltage applied to the probe, and sends it to the A input of the lock-in amplifier 29. Lock-in amplifier 29 is referenced to audio amplifier 104 which drives the speaker 37. Thus, lock-in amplifier 29 is operable to select ac current corresponding to the frequency at which probe 32 is being driven.

The potential of the common (+) side of amplifier 90 corresponds to the potential of the probe head, and is sent to the B input of lock-in amplifier 29. Since the sample is grounded, the B input representing the probe potential is floated or adjusted with respect to ground 39. It will be recognized by those skilled in electronics that "ground" in this context merely refers to a fixed potential against which other potentials are referenced.

Detection means 30 includes nulling circuit 33 for adjusting the probe potential to create the null current flow condition. The probe potential may be controlled via either a manual control associated with voltage source 35 (not shown) or by a nulling amplifier 98, both of which are included in the nulling circuit 33 of FIG. 3. Nulling circuit 33 is associated with a voltmeter 37 from which the probe potential can be read. An oscilloscope 102 is optionally included for visualizing the ac current. Oscilloscope 102 may be connected directly to the probe head, or may receive the probe head signal via input A of lock-in amplifier 29 as shown in FIG. 3. Optionally, a chart or strip recorder is connected to voltmeter 37 to record the probe readings.

While the method, the reference device, and the probe are described with respect to specific embodiments, it is understood that these are for purposes of illustration and explanation. The claims themselves recite the elements regarded as essential to the invention.

What is claimed is:
1. A method of making measurements reflective of the work function of a sample surface, said method comprising:
providing a sample surface of an electrically conductive sample;
providing an electrochemical half-cell with a cell electrode in a cell electrolyte;
providing a reference surface which is the surface of a reference electrolyte and connecting said reference electrolyte to be in galvanic communication with said cell electrolyte;
providing a probe which is positionable proximate said sample surface and said reference surface, said probe having an electrically conductive portion;
providing detection means and electrically connecting said detection means to said conductive portion of said probe and to said cell electrode to form a first capacitive circuit;

providing capacitance varying means for varying the capacitance of said first capacitive circuit;

positioning said conductive portion of said probe proximate said reference surface;

operating said capacitance varying means to vary the capacitance of said first capacitive circuit thereby causing a detectable current flow, and operating said detection means to obtain a first measurement which is reflective of the contact potential difference between said reference surface and said probe;

connecting said sample to said detection means to form a second capacitive circuit;

repositioning said conductive portion of said probe proximate said simple surface;

operating said capacitance varying means to vary the capacitance of said second capacitive circuit and said detection means to obtain a second measurement which is reflective of the contact potential difference between said sample surface and said probe; and deriving a value reflective of the work function of said sample surface from said reference measurement, a known value of the half-cell potential of said half-cell, and said sample measurement.

2. The method of claim 1, wherein said detection means contains a source of electrical power operable to provide a selectably variable electrical potential, and wherein said detection means is further operable to hold said sample or said cell electrode at a fixed potential while applying said electrical potential to said conductive portion of said probe.

3. The method of claim 1, further including a step of repeating said step of obtaining a reference measurement, and wherein fresh reference electrolyte is added to the reference surface prior to said step of repeating a reference measurement.

4. The method of claim 1, wherein said half-cell is a well-defined, substantially stable reference half-cell having a known half-cell potential.

5. The method of claim 4, wherein said electrochemical half-cell is selected from the group consisting of: calomel, mercury-mercury sulfate, and silver-silver chloride.

6. The method of claim 4, wherein said reference electrolyte is an unsaturated aqueous salt solution.

7. The method of claim 6, wherein said reference electrolyte is selected from the group consisting of: potassium chloride, sodium chloride, sodium fluoride, disodium phosphate, dipotassium phosphate, sodium sulfate, potassium sulfate.

8. The method of claim 1, wherein said detection means includes switching means having an output, a first input electrically connected to said sample surface and a second input electrically connected to said cell electrode, said switching means being operable for alternating electrical connection of said first input and said second input to said output to form said first capacitive circuit and said second capacitive circuit as selected by the user upon operation of said switching means.

9. The method of claim 1, further including positioning said probe, said sample surface and said electrochemical within an enclosure, evacuating said enclosure to remove air therefrom, and supplying a selected gas to said enclosure.

10. The method of claim 1, wherein said capacitance varying means includes irradiation means positioned to irradiate the gas positioned between said conductive portion of said probe and said reference surface or sample surface to vary the dielectric constant of said first or second capacitive circuits, respectively 11. The method of claim 1, Wherein said capacitance varying means includes vibration means operably associated with said conductive portion of said probe to mechanically vibrate and vary the capacitance of said first or second capacitive circuits.

12. The method of claim 11, wherein said capacitance varying means includes acoustic means connected to supply acoustic energy to impinge on said conductive portion of said probe to cause deflection thereof relative to said reference surface or sample surface.

13. A method of making a calibrated measurement of the contact potential difference between the surface of a sample of an electrically conductive material and a probe in a gas environment, said method comprising the steps of:

providing apparatus having a probe for placement proximate but not in contact with the surface of a conductive sample, said probe having a conductive portion with vibration means connected thereto to vibrate said conductive portion, detection means connected to the conductive portion of said probe electrode and operable to determine the contact potential difference between the conductive portion of said probe and the sample surface, and a reference standard comprising an electrochemical half-cell including a cell electrolyte which is in galvanic communication with a reference electrolyte having a reference surface;

placing the conductive portion of said probe in proximity to the said reference surface;

electrically connecting the half-cell electrode to the detection means to complete a capacitive circuit with the probe;

operating the detection means to determine the contact potential difference between the conductive portion of said probe and the reference surface to produce a calibration measurement;

placing the conductive portion of said probe in proximity to the surface of the conductive sample;

disconnecting the half-cell electrode from the detection means and electrically connecting said conductive sample to the detection means to complete the external circuit with the probe;

measuring the contact potential difference between the conductive portion of said probe and the surface of the conductive sample to produce a test measurement; and calculating a test value from a comparison of said test measurement and said calibration measurement.

14. Apparatus for measuring a property of a surface of a conductive material, said apparatus comprising:

a reference standard having an electrochemical half-cell with a cell electrode conductively associated with a cell electrolyte, and having a reference electrolyte in galvanic communication with said cell electrolyte, said reference electrolyte having a reference surface;

a probe having a conductive portion for positioning in a first position proximate the surface of a sample conductive material to form a first capacitor and for positioning in a second position proximate the reference surface to form a second capacitor;

capacitance varying means operably associated with said probe for varying the capacitance of said first or second capacitors;

detection means connected to said conductive portion of said probe, to said cell electrode and to said surface of said sample conductive material, said detection means being operable to obtain a first measurement which is reflective of the half-cell potential of said half-cell and to obtain a second measurement which is reflective of the contact potential difference between said sample surface and said conductive portion of said probe in said first position, said contact potential difference constituting a property of said surface.

15. The apparatus of claim 14, wherein said detection means is operable to display an adjusted value of said sample measurement reflective of the work function of said sample surface evaluated in relation to said reference measurement and said half-cell potential.

16. The apparatus of claim 14, wherein said detection means includes a source of electrical power providing a selectable potential and an effective fixed potential, and wherein said detection means is further operable to hold said electrode of said half-cell or said sample at said fixed potential while applying said selectable potential to said conductive portion of said probe.

17. The apparatus of claim 14, wherein said detection means includes:

switching means having a first input conductively connected to said conductive portion and a second input conductively connected to said cell electrode, said switching means having an output and being operable to selectively conductively connect said first input and said second input to said output; and operation means conductively connected to said output of said switching means and to said conductive portion of said probe.

18. The apparatus of claim 14, wherein said reference electrolyte is said cell electrolyte.

19. The apparatus of claim 14, further including means for refreshing the surface of said reference electrolyte at desired intervals operably associated with said reference standard.

20. The apparatus of claim 14, wherein said electrochemical half-cell electrode is a defined reference half-cell having a stable, known half-cell potential.

21. The apparatus of claim 14, wherein said electrolyte solution is an unsaturated aqueous solution of a salt.

22. The apparatus of claim 21, wherein said salt is selected from the group consisting of: potassium chloride, sodium chloride, sodium sulfate, potassium sulfate, sodium nitrate, potassium nitrate, sodium fluoride, disodium phosphate, dipotassium phosphate.

23. The apparatus of claim 14, wherein said probe has a body with a first end and a second end, and wherein said conductive portion is a piece of flexible conductive film disposed to cover said first end of said body, said flexible conductive film being electrically connected to said detection means.

24. The apparatus of claim 14, wherein said flexible conductive film includes a metal having a surface oxide coating.

25. The apparatus of claim 23, wherein said flexible conductive film is aluminum or an aluminum coated material.

26. The apparatus of claim 14 wherein said capacitance varying means is a source of radiation positioned to irradiate said first capacitor or second capacitors to vary the capacitance thereof.

27. The apparatus of claim 14 wherein said capacitance varying means is vibration means operably associated with said conductive portion of said probe for varying the capacitance of said first or second capacitors.

28. The apparatus of claim 27, wherein said capacitance varying means is a source of acoustic energy connected to said second end of said probe to transmit acoustic energy to vibrate said flexible conductive film.

29. A probe useful for measuring the contact potential difference between the probe and a sample with the vibrating capacitor technique, comprising:

a probe body having a first end and a second end;

a flexible conductive film disposed to cover said first end of said body;

acoustic vibration means operably associated with said second end of said body to generate acoustic energy and to supply it through said second end to said flexible conductive film for causing said flexible conductive film to vibrate;

electrical connection means associated with said flexible conductive film for connecting said flexible conductive film to an external detection circuit.

30. The probe of claim 29, wherein said acoustic vibration means includes a speaker disposed to direct acoustic energy into said body toward said flexible conductive film and speaker drive means operably associated with said speaker for driving said speaker to produce said acoustic energy.

31. Apparatus for measuring the contact potential difference between a probe and a surface, comprising: a probe having a conductive portion for positioning proximate the surface of a sample conductive material to form a test capacitor, wherein said conductive portion of said probe and said surface constitute a pair of capacitor plates;

capacitance varying means operably disposed for varying the capacitance of said capacitor to cause a detectable current flow between said capacitor plates;

an external circuit connected to said capacitor plates to complete a capacitance circuit and operable to hold one of said plates at a fixed potential relative to the other said plate;

detection means associated with said external circuit and operable to:

detect said current;

apply a voltage to nullify said current, and read the applied voltage to generate a sample measurement reflective of the contact potential difference between said surface and said probe; and a reference standard connectable to said external circuit and having a reference surface adjacent which said probe is placeable to form a reference capacitor circuit, said reference standard comprising an electrochemical half-cell in electrical contact with an electrolyte solution, said solution having a surface which constitutes said reference surface, and said half-cell including a half-cell electrode connectable to said external circuit;

wherein when said half-cell electrode is connected to said external circuit and said probe is positioned adjacent said reference surface, said capacitance varying means is further operable to vary the capacitance of said reference capacitor to cause a reference current to flow, and said detection means is further operable to:
- detect said reference current,
- apply a voltage to nullify said current, and
- read the applied voltage to produce a reference measurement reflective of the half-cell potential of said half-cell, and
- to receive and compare said sample measurement and said reference measurement to generate a display signal reflective of the work function between said probe and said surface.

32. Apparatus for making a calibrated measurement of the contact potential difference between a probe and a surface, comprising:
- a probe having a conductive portion for positioning proximate test surface of a sample conductive material to form a test capacitor, wherein said conductive portion of said probe and said surface constitute first and second capacitor plates;
- an external circuit including a source of electrical power connectable to said first and second capacitor plates to complete a capacitance circuit, and operable to hold one of said first and second capacitor plates at a fixed potential relative to the other of said first and second capacitor plates;
- calibration means for calibrating a sample measurement, comprising an electrochemical half-cell in galvanic contact with an elecrtrolyte solution, said electrochemical half-cell being selected from the group of half-cells having known absolute half-cell potentials, said solution having a calibration surface adjacent which said probe is positionable to form a calibrating capacitor, and said electrochemical half-cell including a half-cell electrode connectable to said external circuit;
- capacitance varying means operably disposed for varying the capacitance of said test capacitor or said calibration capacitor to cause a detectable current flow between said first and second capacitor plates;
- detection means associated with said external circuit for detecting said circuit, and operable to:
  - operate said external circuit to apply a first voltage to nullify said current when said test capacitor is formed,
  - read said first voltage to generate a sample measurement reflective of the contact potential difference between said sample surface and said probe,
  - detect a calibration current flowing in said external circuit when said calibration capacitor is formed,
  - apply a second voltage to nullify said calibration current, and
  - read said second voltage to generate a calibration measurement reflective of said half-cell potential.

33. The method of claim 32, wherein said electrochemical half-cell is selected from the group consisting of: calomel, mercury-mercury sulfate, and silver-silver chloride.

34. The method of claim 33, wherein said electrolyte solution is an unsaturated aqueous salt solution.

35. The method of claim 34, wherein said electrolyte solution is selected from the group consisting of: potassium chloride, sodium chloride, sodium fluoride, disodium phosphate, dipotassium phosphate, sodium sulfate, potassium sulfate.

36. The apparatus of claim 31, wherein said electrochemical half-cell is selected from the group consisting of: calomel, mercury-mercury sulfate, and silver-silver chloride, and said electrolyte solution is an unsaturated aqueous salt solution.

37. The method of claim 1, wherein said detection means is operable to adjust said second measurement according to said first measurement to generate a third signal reflective of the absolute work function of said sample surface, and wherein said step of deriving a value reflective of the work function comprises operating said detection means to generate said third signal.

* * * * *